US010269416B1

(12) United States Patent
Gupta et al.

(10) Patent No.: US 10,269,416 B1
(45) Date of Patent: Apr. 23, 2019

(54) DUMMY WORDLINE TRACKING CIRCUITRY

(71) Applicant: ARM Limited, Cambridge (GB)

(72) Inventors: Lalit Gupta, Cupertino, CA (US);
Jitendra Dasani, Cupertino, CA (US);
Vivek Nautiyal, Milpitas, CA (US);
Fakhruddin Ali Bohra, Austin, TX (US)

(73) Assignee: ARM Limited, Cambridge (GB)

( * ) Notice: Subject to any disclaimer, the term of this patent is extended or adjusted under 35 U.S.C. 154(b) by 2 days.

(21) Appl. No.: 15/789,715

(22) Filed: Oct. 20, 2017

(51) Int. Cl.
G11C 11/417 (2006.01)
G11C 11/418 (2006.01)
H01L 23/528 (2006.01)
H01L 27/11 (2006.01)
G11C 11/412 (2006.01)

(52) U.S. Cl.
CPC .......... G11C 11/417 (2013.01); G11C 11/412 (2013.01); G11C 11/418 (2013.01); H01L 23/528 (2013.01); H01L 27/1104 (2013.01)

(58) Field of Classification Search
CPC ... G11C 11/418; G11C 11/412; H01L 23/528; H01L 27/1104
See application file for complete search history.

(56) References Cited

U.S. PATENT DOCUMENTS

| 6,356,503 B1* | 3/2002 | Roy ......................... G11C 8/10 365/149 |
| 2005/0073885 A1* | 4/2005 | Suzuki ..................... G11C 7/08 365/185.2 |
| 2009/0040846 A1* | 2/2009 | Chang ...................... G11C 7/22 365/194 |

* cited by examiner

Primary Examiner — Ajay Ojha
(74) Attorney, Agent, or Firm — Pramudji Law Group PLLC; Ari Pramudji

(57) ABSTRACT

Various implementations described herein are directed to an integrated circuit. The integrated circuit may include dummy wordline circuitry having a dummy wordline driver coupled to multiple dummy wordline loads via a dummy wordline. The integrated circuit may include demultiplexer circuitry coupled to a first path of the dummy wordline between the dummy wordline driver and the multiple dummy wordline loads. The integrated circuit may include multiplexer circuitry coupled to a second path of the dummy wordline between the multiple dummy wordline loads and a dummy bitline load. The demultiplexer circuitry and the multiplexer circuitry may be controlled with one or more selection signals to select at least one of the multiple dummy wordline loads.

20 Claims, 4 Drawing Sheets

DUMMY WORDLINE TRACKING CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, multiple patterning (or multi-patterning, such as double-patterning) may refer to a class of technologies for manufacturing integrated circuits (ICs) that were developed for photolithography to enhance feature density of circuit components. Multiple patterning was developed based on the premise that a single lithographic exposure may not be enough to provide sufficient resolution. Hence, additional exposures were needed, because positioning patterns using etched feature sidewalls (e.g., using spacers) would otherwise be necessary. Although EUVL (i.e., Extreme Ultraviolet Lithography) has been projected to be a next-generation lithography of choice, EUVL may still require more than one lithographic exposure, due to an foreseen need to first print a series of lines and then cut them. Therefore, it is thus considered likely that more than one cut would be needed, even for EUVL. Further, even for electron beam lithography (i.e., e-beam lithography), single exposure may also be insufficient, hence also requiring double patterning. Thus, there exists a need to improve lithography techniques to enhance feature density of circuit components when manufacturing integrated circuits (ICs).

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to dummy wordline (DWL) tracking circuitry for memory applications. For instance, various implementations described herein describe schemes and techniques that enable dummy wordline (DWL) tracking in double or dual patterning to optimize timing and power. In another instance, various implementations described herein provide a power and timing optimized wordline tracking scheme for memory applications using marked set-grouping of wordlines, such as color-marked wordlines. For instance, in reference to a metal layer for bitcell layout, alternate wordlines may be represented with different colors based on different resistive loads, such as, e.g., red colored wordlines may be identified (or marked) as more resistive when compared to green colored wordlines, wherein a red color for WL0 may be used for a first mask (e.g., Mask A may refer to a more resistive load), while a green color for WL1 may be used for a second mask (e.g., Mask B may refer to a less resistive load). Further, in reference to dummy wordline (DWL) tracking, an important role of DWL tracking is to track variation in metal resistance. For instance, if wordline (WL) metal resistance varies, then DWL metal resistance should track the variance, and hence self-time path. This may assist in maintaining high yield with process variation. For instance, if DWL is identified or marked with Mask B (e.g., in green color), and if a selected WL is identified or marked with Mask A (e.g., in red color), then there may be a mismatch in tracking, which may lead to poor yield. In another instance, if DWL is identified or marked with Mask A (e.g., in red color), and if a selected WL is identified or marked with Mask B (e.g., in green color), then an extra margin may be left unutilized. Hence, this may result in increased power consumption and slow timing.

Various implementations of dummy wordline (DWL) tracking circuitry will now be described in greater detail herein with reference to FIGS. 1-4.

Figure 1:
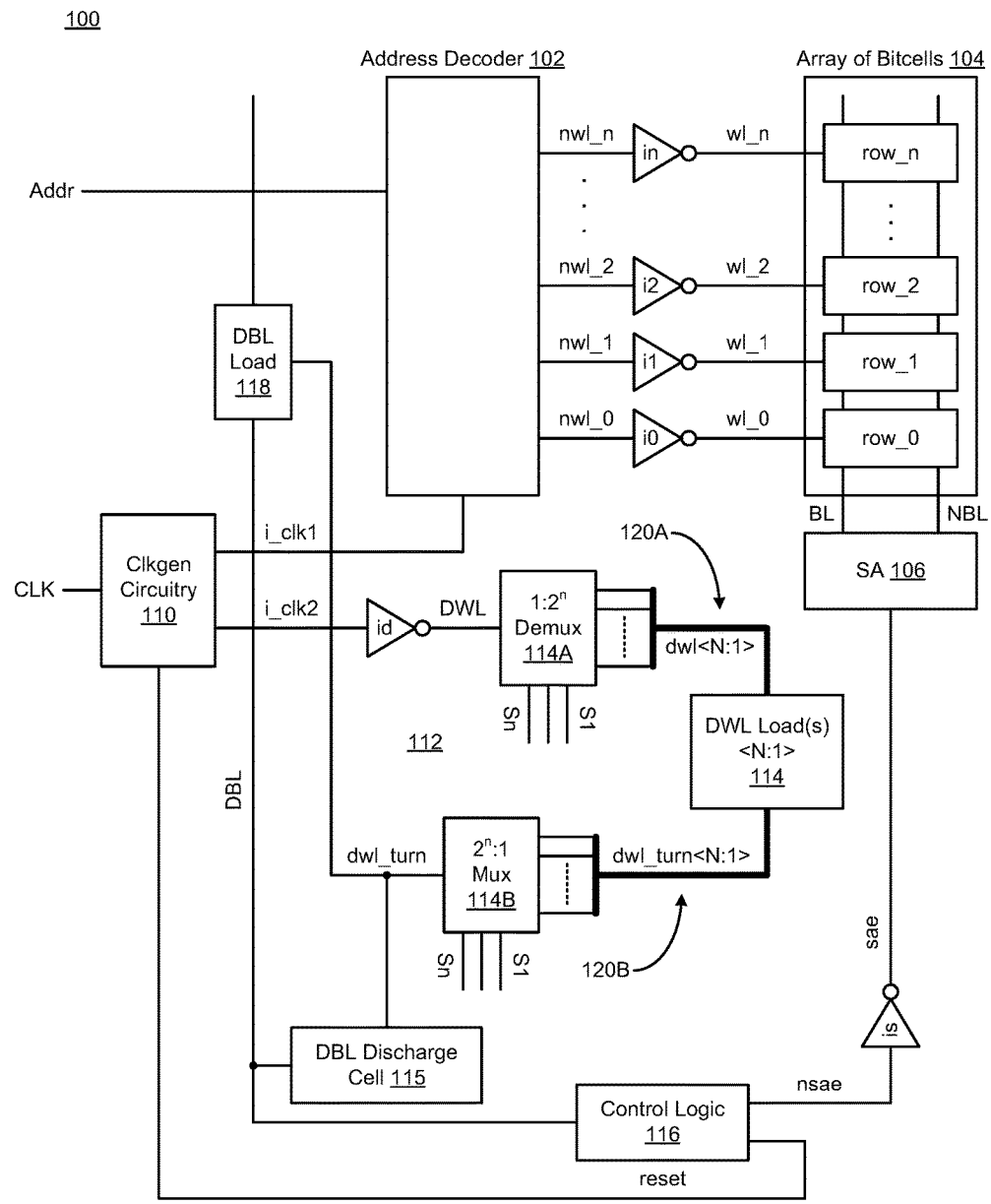
FIG. 1 illustrates a block diagram of memory circuitry having dummy wordline (DWL) tracking circuitry in accordance with various implementations described herein.

FIG. 1 illustrates a diagram of memory circuitry 100 having dummy wordline (DWL) tracking circuitry 112 in accordance with implementations described herein.

As shown in FIG. 1, the memory circuitry 100 may include various circuitry including an address decoder 102, an array of bitcells 104, sense amplifier circuitry 106, clock generation circuitry 110, and the dummy wordline (DWL) tracking circuitry 112. The memory circuitry 100 may include the array of multiple bitcells 104 arranged in multiple rows of bitcells (row_0, row_1, row_2, . . . , row_n). The multiple bitcells may be selectable via multiple wordlines (wl_0, wl_1, wl_2, . . . , wl_n). The memory circuitry 100 may include multiple wordline drivers (inverters i0, i1, i2, . . . , in) coupled to respective bitcells of the multiple bitcells via respective wordlines of the multiple wordlines (wl_0, wl_1, wl_2, . . . , wl_n). Further, as shown, each row of the multiple rows (row_0, row_1, row_2, . . . , row_n) may utilize a respective wordline of the multiple wordlines (wl_0, wl_1, wl_2, . . . , wl_n) and a respective wordline driver of the multiple wordline drivers (inverters i0, i1, i2, . . . , in) to select a respective bitcell of the multiple bitcells. I.e., each of the inverted wordlines (nwl_0, nwl_1, nwl_2, . . . , nwl_n) has a respective wordline driver (inverters i0, i1, i2, . . . , in) coupled thereto to provide wordline signals via the multiple wordlines (wl_0, wl_1, wl_2, . . . , wl_n) to the respective rows of bitcells (row_0, row_1, row_2, . . . , row_n).

In some implementations, the multiple rows of bitcells may be separated in even numbered rows of bitcells (row_0, row_2, row_4, . . . , row_n_even) and odd numbered rows of bitcells (row_1, row_3, row_5, . . . , row_n_odd). The even numbered rows (row_0, row_2, row_4, . . . , row_n_even) may define first resistive wordline loads having first resistive values, and the odd numbered rows (row_1, row_3, row_5, . . . , row_n_odd) may define second resistive wordline loads having second resistive values that are less than the first resistive values. The first resistive wordline load may be a high resistive wordline load having a high resistive value, and the second resistive wordline load may be a low resistive wordline load having a low resistive value. The even numbered rows (row_0, row_2, row_4, . . . , row_n_even) may be marked with a first color to thereby identify the first resistive values of the first resistive wordline loads, and the odd numbered rows (row_1, row_3, row_5, . . . , row_n_odd) may be marked with a second color that is different than the first color to thereby identify the second resistive values of the second resistive wordline loads. The first and second colors may be any colors that are different; e.g., the first color may be red, and the second color may be green.

Further, the sense amplifier circuitry 106 may be coupled to each of the bitcells in each of the rows of bitcells (row_0, row_1, row_2, . . . , row_n) via complementary bitlines (BL, NBL). The memory circuitry 100 may also include a number of inverted wordlines (nwl_0, nwl_1, nwl_2, . . . , nwl_n) that are coupled between the address decoder 102 and respective rows of bitcells (row_0, row_1, row_2, . . . , row_n) for access to each of the bitcells based on a selected wordline.

The memory circuitry 100 may receive a clock signal CLK and an address signal Addr. The clock generation circuitry (Clkgen) 110 may receive the clock signal CLK and provide one or more internal clock signals, such as, e.g., a first internal clock signal i_clk1 to the address decoder 102 and a second internal clock signal i_clk2 to a dummy wordline driver (inverter id) via a dummy wordline (DWL). Further, the address decoder 102 may receive multiple signals including, e.g., the address signal Addr and the first internal clock signal i_clk1 and then access at least one inverted wordline (nwl_0, nwl_1, nwl_2, . . . , nwl_n) based on the received address (Addr), as a data input signal. As described herein, the received address (Addr) may include a number of bits, wherein at least one of the bits of the received address (Addr) may be utilized as a row address bit for the selection signal (S1, S2, . . . , Sn) to thereby select the even numbered rows (row_0, row_2, row_4, . . . , row_n_even) or the odd numbered rows (row_1, row_3, row_5, . . . , row_n_odd).

As shown in FIG. 1, the DWL driver (id), the DWL tracking circuitry 112, one or more dummy wordline (DWL) load(s) 114, and a dummy bitline (DBL) discharge cell 115 are coupled together via the dummy wordline DWL. The memory circuitry 100 may also include control logic circuitry 116 and a dummy bitline (DBL) load 118 coupled to the dummy bitline (DBL). The control logic circuitry 116 may be coupled to the sense amplifier circuitry 106 via another inverter (is). The control circuitry 116 may provide an inverted sense amplifier enable signal (nsae) to the inverter (is), and the inverter (is) may then provide a complementary sense amplifier enable signal (sae). Further, the second internal clock signal i_clk2 may be input to the dummy wordline driver (inverter id) via the dummy wordline DWL, which may be coupled to the DWL load(s) 114 via a DWL demultiplexer 114A.

As shown in FIG. 1, the DWL driver (id) may be coupled to one or multiple DWL load(s) 114 via the dummy wordline DWL. The memory circuitry 100 may further include DWL demultiplexer circuitry 114A and DWL multiplexer circuitry 114B. The demultiplexer circuitry 114A may be coupled to a first path 120A of the dummy wordline DWL between the DWL driver (id) and the DWL load(s) 114. The DWL multiplexer circuitry 114B may be coupled to a second path 120B of the dummy wordline DWL between the DWL load(s) 114 and the DBL load 118. The DWL demultiplexer circuitry 114A and the DWL multiplexer circuitry 114B are controlled with one or more selection signals (S1, S2, . . . , Sn) to select at least one of the multiple DWL load(s) 114 based on matching a resistive wordline load of a selected wordline (wl_0, wl_1, wl_2, . . . , wl_n).

As shown in FIG. 1, the multiple DWL loads 114 (<N:1>) may include a first resistive DWL load with a first resistive dummy value, and the multiple DWL loads 114 (<N:1>) may include a second resistive DWL load having a second resistive dummy value that is less than the first resistive dummy value. The one or more selection signals (S1, S2, . . . , Sn) may be utilized to control selection of the first resistive dummy wordline load or the second resistive dummy wordline load based on the matching of the resistive wordline load of the selected wordline. The dwl<N:1> line and the dwl_turn<N:1> line are bolded to represent DWL bus with a different mask, e.g., dwl<0>→Mask A, while dwl<1>→Mask B.

In some implementations, the first resistive dummy value of the first resistive dummy wordline load may correspond to a first set of bitcells of the multiple bitcells that are disposed in the even numbered rows (row_0, row_2, row_4, . . . , row_n_even) of the array of multiple bitcells 104. The second resistive dummy value of the second resistive dummy wordline load may correspond to a second set of bitcells of the multiple bitcells that are disposed in the odd numbered rows (row_1, row_3, row_5, . . . , row_n_odd) of the array of multiple bitcells 104. The second resistive dummy value may be less than the first resistive dummy value. Further, the first resistive dummy wordline load may be a high resistive dummy wordline load having a high resistive dummy value, and the second resistive dummy wordline load may be a low resistive dummy wordline load having a low resistive dummy value.

The DWL demultiplexer circuitry 114A may receive an inverted clock signal from the DWL driver (id) via the first path 120A. The DWL demultiplexer circuitry 114A may provide a demux signal (dwl<N:1>) to the multiple DWL loads 114 (<N:1>). The DWL demultiplexer circuitry 114A may select the first DWL load or the second DWL load via the first path 120A based on the inverted clock signal and the one or more selection signals (S1, S2, . . . , Sn). For instance, one or more of the selection signals (S1, S2, . . . , Sn) may be based on row address selection; e.g., a row address bit taken from the row address (Addr) may be used for selecting an even and odd wordline, and as such, the same row address bit may be used to select the same mask (e.g., Mask A or Mask B) for dummy wordline (DWL) matching of selected wordline WL). Further, as shown, the DWL demultiplexer circuitry 114A may be embodied with a 1:$2^n$ demultiplexer (Demux).

The DWL multiplexer circuitry 114B may receive a mux signal (dwl_turn<N:1>) from the multiple DWL loads 114 (<N:1>). For instance, the multiplexer circuitry 114B may provide the dummy bitline (DBL) load to the dummy bitline (DBL) via the second path 120B based on the selected DWL load and the one or more selection signals (S1, S2, . . . , Sn). Further, as shown, the DWL multiplexer circuitry 114B may be embodied with a $2^n$:1 multiplexer (Mux). In various implementations, the selected DWL load matches (or may be adapted to match) the resistive wordline load of the selected wordline.

In reference to dual patterning, multiple wordlines may be interleaved in such a manner that one or more or all even numbered wordlines may be marked (or identified) with a first mask (e.g., Mask A), while one or more or all odd numbered wordlines may be marked (or identified) with a second mask (e.g., Mask B). In this instance, the first mask (e.g., Mask A) may be marked (or identified) as more resistive than the second mask (e.g., Mask B). This may be decoded by at least one bit of a row address (Addr). Accordingly, various implementations described herein utilize multiple dummy wordlines (e.g., one with Mask A and another with Mask B) to select matching DWL loads 114 (<N:1>) based on the selection signal (S1, S2, . . . , Sn) that may be associated with a row address bit, which may be used for selecting an even or odd (Mask A or Mask B) wordline. As described herein above, one or more of the selection signals (S1, S2, . . . , Sn) may be based on row address selection; e.g., a row address bit taken from the row address (Addr) may be used for selecting an even and odd wordline, and as such, the same row address bit may be used to select the same mask (e.g., Mask A or Mask B) for dummy wordline (DWL) matching of selected wordline WL). In reference to multi-patterning, one or more or all $2^n$ wordlines may be in the same mask, while one or more or all $2^{n-1}$ wordlines may be in different mask. I.e., one or more or all $2^n$ wordlines may have a different mask and resistance, which may be repeated with $2^{n+1}$ wordlines. Any bit (e.g., N Bit) of a row address (Addr) may be used to demultiplex and multiplex the dummy wordline via the selection signals (S1, S2, . . . , Sn) to select a matching DWL load 114 so as to thereby match the resistive load of the selected wordline.

Various implementations as described herein of selecting a row address bit may be applied to a least significant bit (LSB), e.g., in reference to a row address (Addr). In addition, various implementations as described herein of selecting a row address bit may be applied to any bit in a bit sequence of the row address (Addr), such as, e.g., a most significant bit (MSB). Alternatively, an external signal may be used as a reference signal for the row address bit. Further, various implementations applied to coloring the dummy wordline (DWL) may also be applied to coloring the dummy bitline (DBL).

In various implementations, each bitcell in the array of bitcells 104 may also be referred to as a memory cell, and each bitcell may be configured to store at least one data bit value (a data value associated with logical '0' or '1'). Each row of bitcells (row_0, row_1, row_2, . . . , row_n) in the array of bitcells 104 may include any number of bitcells or memory cells arranged in various configurations, such as, e.g., a two-dimensional (2D) memory array having columns and rows of multiple bitcells arranged in a 2D grid pattern with 2D indexing capabilities. Further, each bitcell may be implemented, e.g., with random access memory (RAM) circuitry, or some other type of volatile type memory. For instance, each memory cell may include a multi-transistor static RAM (SRAM) cell, including various types of SRAM cells, such as, e.g., 6T CMOS SRAM and/or other types of complementary MOS (CMOS) SRAM cells, such as, e.g., 4T, 8T, 10T, or more transistors per bit.

Generally, there are multiple types of memory structures: one-wordline devices (i.e., single port) and multi-wordline devices (i.e., multi-port memory, such as, e.g., dual port memory). One-wordline devices (ROM, RAM, DRAM, SRAM, etc.) may refer to devices having only one access port, which may be referred to as access devices. The bitlines may utilize single rail or dual rail architecture. The transistor types (N-type MOS and P-type MOS) may be referred to as access transistors. In some scenarios, high-density SRAM bitcells that are implemented with minimally sized transistors may limit Vmin of a design. However, in FinFET technology, device sizing quantization remains a challenge for compact 6T SRAM bitcells with minimum-size transistors. Thus, in some implementations, careful optimization of design memory assist circuits may be used to deliver low power memory operation. Further, each bitcell in the array of bitcells 104 may be accessed with a wordline WL and complementary bitlines BL, NBL.

Generally, static RAM bitcells may include 6T bitcells, which may have access ports controlled by wordlines (WLs). In some instances, static RAM (SRAM) bitcells may be implemented with a 5T bitcell, 4T 2R bitcell, or various other types of CMOS SRAM cells, such as, e.g., 8T, 10T or more transistors per bit. Further, multi-wordlines may result in multiple access ports into each of the bitcells. Since there are multiple access ports, the multi-ports access devices may be varied within each bitcell so that some access devices (by port) are NFETs and some access devices by port are PFETs. Although these may be effectively varied within each single bitcell, their number of ports may not be easily divided into equal capacitance and/or power. Thus, although these multi-ports transistor types may vary within each bitcell, there may also be a need to have a variation between arrays as in a left half array and a right half array.

The memory circuitry 100 including each bitcell in the array of bitcells 104 may be implemented as an integrated circuit (IC) with various types of memory circuitry, such as, e.g., random access memory (RAM), and/or any other types of memory, including any type of volatile memory and non-volatile memory. The memory circuitry 100 may be implemented as an IC with single and/or dual rail memory architectures. The memory circuitry 100 may also be integrated with computing circuitry and related components on a single chip. Further, the memory circuitry 100 may be implemented in an embedded system for various types of electronic, mobile, and/or biometric applications.

Figure 2:
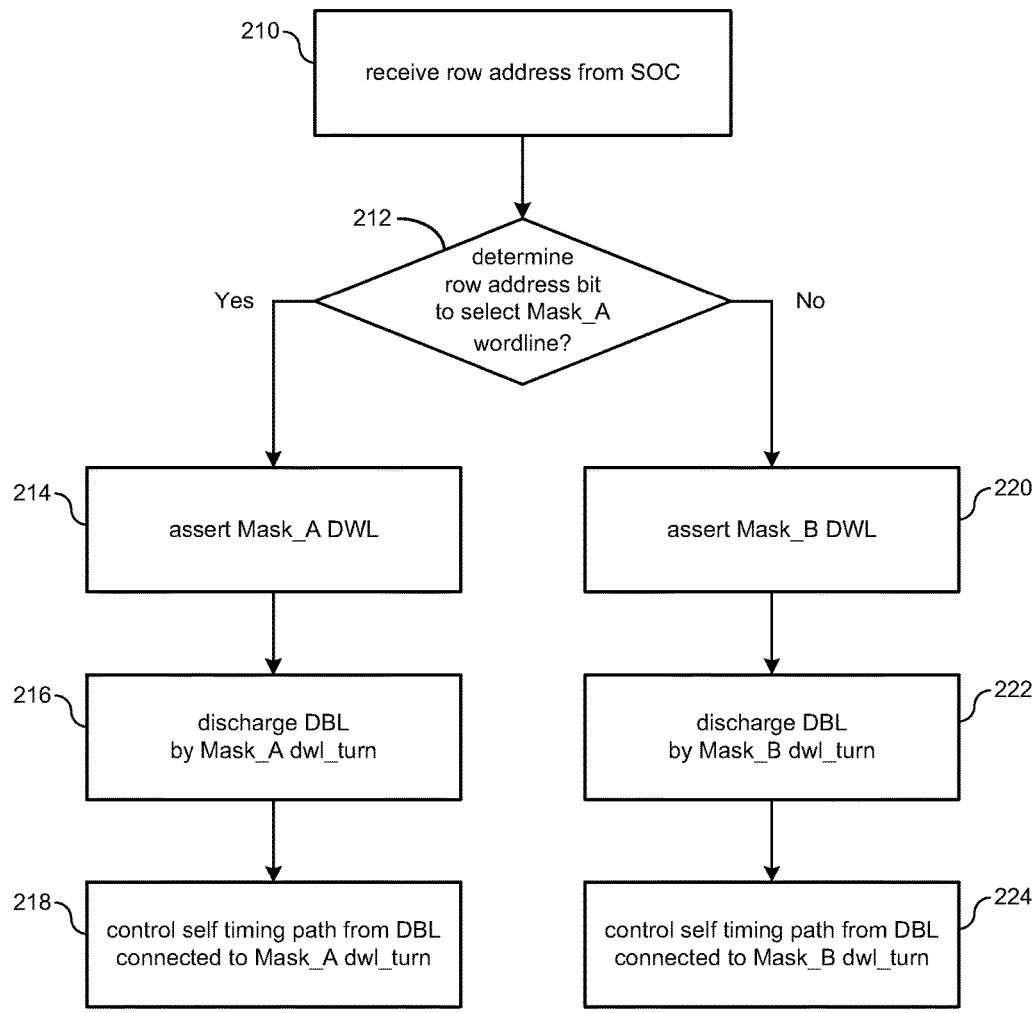
FIG. 2-3 illustrate process flow diagrams of methods for implementing dummy wordline (DWL) tracking circuitry in accordance with implementations described herein.
Figure 3:
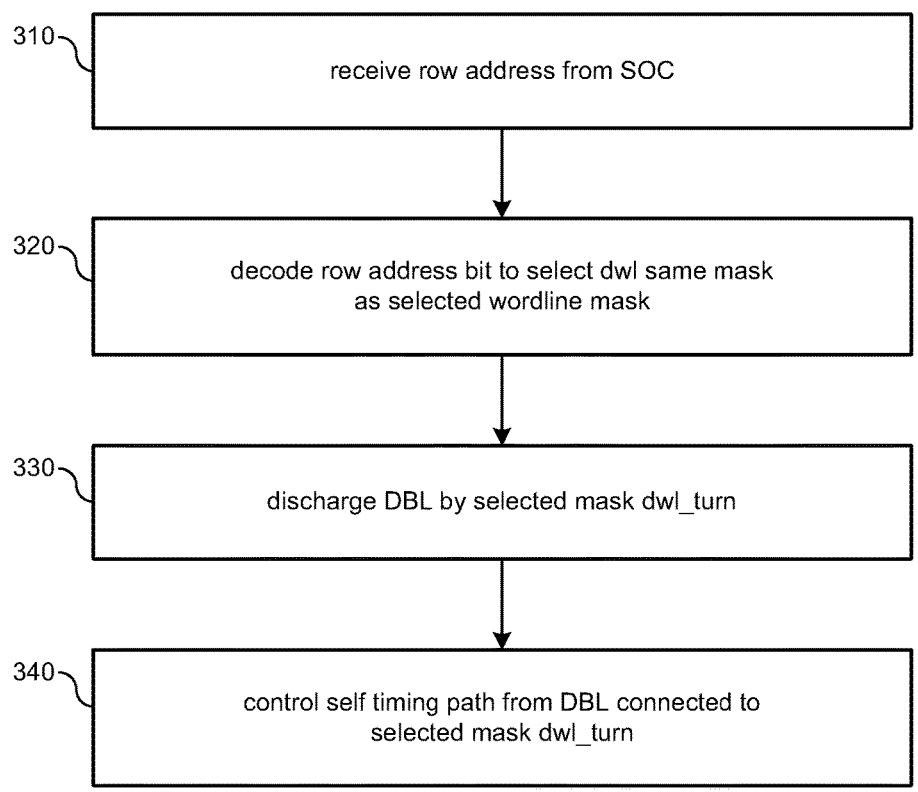

FIG. 2-3 illustrate various process flow diagrams of methods for implementing dummy wordline (DWL) tracking circuitry in accordance with implementations described herein. In particular, FIG. 2 refers to a process flow of a method 200 for implementing DWL tracking circuitry in dual patterning, and FIG. 3 refers to a process flow of a method 300 for implementing DWL tracking circuitry in multi-patterning.

It should be understood that even though methods 200, 300 indicate a particular order of operation execution, in some cases, various certain portions of the operations may be executed in a different order, and on different systems. In other cases, additional operations and/or steps may be added to and/or omitted from methods 200, 300. Methods 200, 300 may be implemented in hardware and/or software. If implemented in hardware, methods 200, 300 may be implemented with various circuit components, as described herein above in reference to FIG. 1. If implemented in software, methods 200, 300 may be implemented as a program or software instruction process that may be configured for dummy wordline (DWL) tracking circuitry as described herein. Further, if implemented in software, instructions related to implementing methods 200, 300 may be stored in memory and/or a database. For instance, a computer or various other types of computing devices having a processor and memory may be configured to perform methods 200, 300.

As described and shown in reference to FIG. 2, method 200 may be utilized for implementing DWL tracking circuitry in various types of memory applications.

At block 210, method 200 may receive a row address (e.g., Addr) from an SoC (system on a chip), and then proceed to block 212. At decision block 212, method 200 may utilize the received row address (e.g., Addr) to determine a row address bit for selecting a first mask, such as, e.g., Mask A. If the row address bit refers to Mask A, then method 200 proceeds to block 214. Otherwise, if the row address bit refers to a second path (e.g., Mask B), then method 200 proceeds to block 220.

At block 214, method 200 may assert the dummy wordline DWL for Mask A by dwl (e.g., via the first path 120A of FIG. 1), and then proceed to block 216. At block 216, method 200 may discharge the dummy bitline DBL for Mask A by dwl_turn (e.g., via the second path 120B of FIG. 1), and then proceed to block 218. At block 218, method 200 may control a self timing path from the dummy bitline DBL that is connected to Mask A by dwl_turn (e.g., via the second path 120B of FIG. 1).

At block 220, method 200 may assert the dummy wordline DWL for Mask B by dwl (e.g., via the first path 120A of FIG. 1), and then proceed to block 222. At block 222, method 200 may discharge the dummy bitline DBL for Mask B by dwl_turn (e.g., via the second path 120B of FIG. 1), and then proceed to block 224. At block 224, method 200 may control a self timing path from the dummy bitline DBL that is connected to Mask B by dwl_turn (e.g., via the second path 120B of FIG. 1), and then method 200 may terminate.

As described and shown in reference to FIG. 3, method 300 may be utilized for implementing DWL tracking circuitry in various types of memory applications.

At block 310, method 300 may receive a row address (e.g., Addr) from an SoC (system on a chip), and then proceed to block 320. At block 320, method 300 may decode a row address bit from the received row address (e.g., Addr) to select the dwl same mask as a selected wordline mask (e.g., via the first path 120A of FIG. 1), and then proceed to block 330. At block 330, method 300 may discharge the dummy wordline DBL by the selected mask dwl_turn (e.g., via the second path 120B of FIG. 1), and then proceed to block 340. At block 340, method 300 may control a self timing path from the dummy bitline DBL that is connected to the selected mask dwl_turn (e.g., via the second path 120B of FIG. 1), and then method 300 may terminate.

Various implementations as described herein of selecting a row address bit may be applied to a least significant bit (LSB), e.g., in reference to a row address (Addr). In addition, various implementations as described herein of selecting a row address bit may be applied to any bit in a bit sequence of the row address (Addr), such as, e.g., a most significant bit (MSB). Alternatively, an external signal may be used as a reference signal for the row address bit. Further, various implementations applied to coloring the dummy wordline (DWL) may also be applied to coloring the dummy bitline (DBL).

Figure 4:
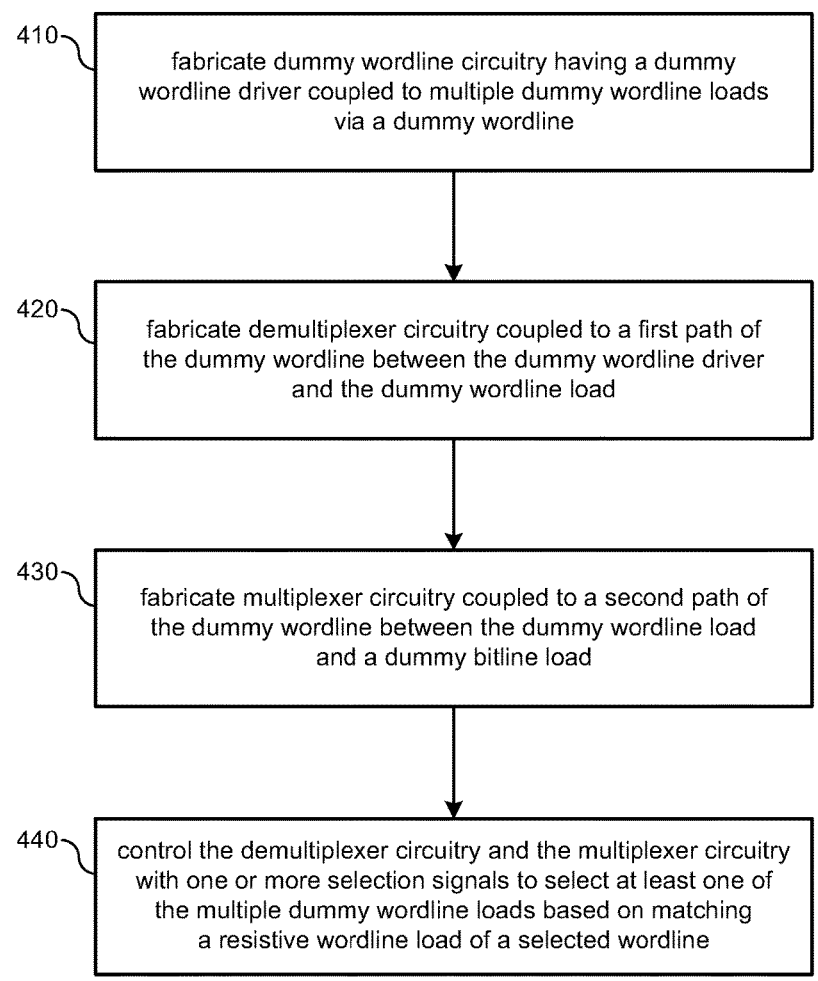
FIG. 4 illustrates a process flow diagram of a method for fabricating dummy wordline (DWL) tracking circuitry in accordance with implementations described herein.

FIG. 4 illustrates a process flow diagram of a method 400 for fabricating DWL tracking circuitry in accordance with implementations described herein.

It should be understood that even though method 400 may indicate a particular order of operation execution, in some cases, various certain portions of the operations may be executed in a different order, and on different systems. In other cases, additional operations and/or steps may be added to and/or omitted from method 400. Also, method 400 may be implemented in hardware and/or software. If implemented in hardware, the method 400 may be implemented with various circuit components, such as described herein above in reference to FIG. 1. If implemented in software, method 400 may be implemented as a program or software instruction process that may be configured for dummy wordline (DWL) tracking circuitry as described herein. Further, if implemented in software, instructions related to implementing the method 400 may be stored in memory and/or a database. For instance, a computer or various other types of computing devices having a processor and memory may be configured to perform method 400.

As described and shown in reference to FIG. 4, method 400 may be utilized for manufacturing an IC that implements DWL tracking circuitry in various types of memory applications. For instance, method 400 may be utilized for manufacturing DWL tracking circuitry for memory applications, wherein the DWL tracking circuitry may be adaptive to pressure, voltage and temperature (PVT).

At block 410, method 400 may fabricate DWL circuitry having a DWL driver coupled to multiple DWL loads via a dummy wordline DWL. The multiple DWL loads may include a first resistive DWL load with a first resistive dummy value, and the multiple DWL loads may include a second resistive DWL load having a second resistive dummy value that is less than the first resistive dummy value.

At block 420, method 400 may fabricate demultiplexer circuitry coupled to a first path of the DWL between the DWL driver and the DWL load. At block 430, method 400 may fabricate multiplexer circuitry coupled to a second path of the DWL between the DWL load and a dummy bitline load. At block 440, method 400 may control the demultiplexer circuitry and the multiplexer circuitry with one or more selection signals to select at least one of the multiple DWL loads based on matching a resistive wordline load of a selected wordline.

In some implementations, the demultiplexer circuitry may receive an inverted clock signal from the DWL driver via the first path, and the demultiplexer circuitry may select the first DWL load or the second DWL load via the first path based on the inverted clock signal and the one or more selection signals. Further, the multiplexer circuitry may receive a selected DWL load associated with selection of the first DWL load or the second DWL load via the second path, and the multiplexer circuitry may provide a dummy bitline load to a dummy bitline via the second path based on the selected DWL load and the one or more selection signals. As described herein above, the selected DWL load may match the resistive wordline load of the selected wordline.

The one or more selection signals may be utilized to control selection of the first resistive DWL load or the second resistive DWL load based on the matching of the resistive wordline load of the selected wordline. The first resistive DWL load may be a high resistive DWL load having a high resistive dummy value, and the second resistive DWL load may be a low resistive DWL load having a low resistive dummy value.

The first resistive dummy value of the first resistive DWL load may correspond to a first set of bitcells of an array of multiple bitcells that are disposed in even numbered rows of the array of multiple bitcells. The second resistive dummy value of the second resistive DWL load may correspond to a second set of bitcells of the multiple bitcells that are disposed in odd numbered rows of the array of multiple bitcells. The second resistive dummy value is less than the first resistive dummy value.

Described herein are various implementations of an integrated circuit. The integrated circuit may include dummy wordline circuitry having a dummy wordline driver coupled to multiple dummy wordline loads via a dummy wordline. The integrated circuit may include demultiplexer circuitry coupled to a first path of the dummy wordline between the dummy wordline driver and the multiple dummy wordline loads. The integrated circuit may include multiplexer circuitry coupled to a second path of the dummy wordline between the multiple dummy wordline loads and a dummy bitline load. The demultiplexer circuitry and the multiplexer circuitry may be controlled with one or more selection signals to select at least one of the multiple dummy wordline loads.

Described herein are various implementations of an integrated circuit. The integrated circuit may include an array of multiple bitcells arranged in multiple rows, and the multiple bitcells may be selectable via multiple wordlines. The integrated circuit may include multiple wordline drivers coupled to respective bitcells of the multiple bitcells via respective wordlines of the multiple wordlines, and each row of the multiple rows may utilize a respective wordline of the multiple wordlines and a respective wordline driver of the multiple wordline drivers to select a respective bitcell of the multiple bitcells. The integrated circuit may include dummy wordline circuitry having a dummy wordline driver coupled to multiple dummy wordline loads via a dummy wordline. The integrated circuit may include demultiplexer circuitry coupled to a first path of the dummy wordline between the dummy wordline driver and the dummy wordline load. The integrated circuit may include multiplexer circuitry coupled to a second path of the dummy wordline between the dummy wordline load and a dummy bitline load. The demultiplexer circuitry and the multiplexer circuitry may be controlled with one or more selection signals to select at least one of the multiple dummy wordline loads based on matching a resistive wordline load of a selected wordline.

Described herein are various implementations of method for manufacturing an integrated circuit. The method may include fabricating dummy wordline circuitry having a dummy wordline driver coupled to multiple dummy wordline loads via a dummy wordline. The method may include fabricating demultiplexer circuitry coupled to a first path of the dummy wordline between the dummy wordline driver and the dummy wordline load. The method may include fabricating multiplexer circuitry coupled to a second path of the dummy wordline between the dummy wordline load and a dummy bitline load. The method may include controlling the demultiplexer circuitry and the multiplexer circuitry with one or more selection signals to select at least one of the multiple dummy wordline loads based on matching a resistive wordline load of a selected wordline.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   dummy wordline circuitry having a dummy wordline driver coupled to multiple dummy wordline loads via a dummy wordline;
   demultiplexer circuitry coupled to a first path of the dummy wordline between the dummy wordline driver and the multiple dummy wordline loads; and
   multiplexer circuitry coupled to a second path of the dummy wordline between the multiple dummy wordline loads and a dummy bitline load,
   wherein the demultiplexer circuitry and the multiplexer circuitry are controlled with one or more selection signals to select at least one of the multiple dummy wordline loads based at least in part on matching a resistive wordline load of a selected wordline.

2. The integrated circuit of claim 1, further comprising:
an array of multiple bitcells arranged in multiple rows, wherein the multiple bitcells are selectable via multiple wordlines; and
multiple wordline drivers coupled to respective bitcells of the multiple bitcells via respective wordlines of the multiple wordlines.

3. The integrated circuit of claim 2, wherein each row of the multiple rows utilizes a respective wordline of the multiple wordlines and a respective wordline driver of the multiple wordline drivers to select a respective bitcell of the multiple bitcells.

4. The integrated circuit of claim 2, wherein the multiple rows are arranged in even numbered rows and odd numbered rows, and wherein the even numbered rows define a first resistive wordline load having a first resistive value, and wherein the odd numbered rows define a second resistive wordline load having a second resistive value that is less than the first resistive value.

5. The integrated circuit of claim 4, wherein the first resistive wordline load comprises a high resistive wordline load having a high resistive value, and wherein the second resistive wordline load comprises a low resistive wordline load having a low resistive value.

6. The integrated circuit of claim 4, wherein the even numbered rows are marked with a first color to thereby identify the first resistive value of the first resistive wordline load, and wherein the odd numbered rows are marked with a second color that is different than the first color to thereby identify the second resistive value of the second resistive wordline load.

7. The integrated circuit of claim 6, wherein the first color comprises red, and wherein the second color comprises green.

8. The integrated circuit of claim 2, wherein the multiple dummy wordline loads comprise a first resistive dummy wordline load with a first resistive dummy value, and wherein the multiple dummy wordline loads comprise a second resistive dummy wordline load having a second resistive dummy value that is less than the first resistive dummy value.

9. The integrated circuit of claim 8, wherein the one or more selection signals are utilized to control selection of the first resistive dummy wordline load or the second resistive dummy wordline load based on the matching of the resistive wordline load of the selected wordline.

10. The integrated circuit of claim 8, wherein the first resistive dummy value of the first resistive dummy wordline load corresponds to a first set of bitcells of the multiple bitcells that are disposed in even numbered rows of the array of multiple bitcells, and wherein the second resistive dummy value of the second resistive dummy wordline load corresponds to a second set of bitcells of the multiple bitcells that are disposed in odd numbered rows of the array of multiple bitcells, and wherein the second resistive dummy value is less than the first resistive dummy value.

11. The integrated circuit of claim 8, wherein the first resistive dummy wordline load comprises a high resistive dummy wordline load having a high resistive dummy value, and wherein the second resistive dummy wordline load comprises a low resistive dummy wordline load having a low resistive dummy value.

12. The integrated circuit of claim 8, wherein the demultiplexer circuitry receives an inverted clock signal from the dummy wordline driver via the first path, and wherein the demultiplexer circuitry selects the first dummy wordline load or the second dummy wordline load via the first path based on the inverted clock signal and the one or more selection signals.

13. The integrated circuit of claim 12, wherein the multiplexer circuitry receives a selected dummy wordline load associated with selection of the first dummy wordline load or the second dummy wordline load via the second path, and wherein the multiplexer circuitry provides a dummy bitline load to a dummy bitline via the second path based on the selected dummy wordline load and the one or more selection signals.

14. The integrated circuit of claim 13, wherein the selected dummy wordline load matches the resistive wordline load of the selected wordline.

15. An integrated circuit, comprising:
an array of multiple bitcells arranged in multiple rows, wherein the multiple bitcells are selectable via multiple wordlines;
multiple wordline drivers coupled to respective bitcells of the multiple bitcells via respective wordlines of the multiple wordlines, wherein each row of the multiple rows utilizes a respective wordline of the multiple wordlines and a respective wordline driver of the multiple wordline drivers to select a respective bitcell of the multiple bitcells;
dummy wordline circuitry having a dummy wordline driver coupled to multiple dummy wordline loads via a dummy wordline;
demultiplexer circuitry coupled to a first path of the dummy wordline between the dummy wordline driver and the dummy wordline load; and
multiplexer circuitry coupled to a second path of the dummy wordline between the dummy wordline load and a dummy bitline load,
wherein the demultiplexer circuitry and the multiplexer circuitry are controlled with one or more selection signals to select at least one of the multiple dummy wordline loads based on matching a resistive wordline load of a selected wordline.

16. The integrated circuit of claim 15, wherein the rows are arranged in even numbered rows and odd numbered rows, and wherein the even numbered rows define a first resistive wordline load having a first resistive value, and wherein the odd numbered rows define a second resistive wordline load having a second resistive value that is less than the first resistive value.

17. The integrated circuit of claim 16, wherein the even numbered rows are marked with a first color to thereby identify the first resistive value of the first resistive wordline load, and wherein the odd numbered rows are marked with a second color that is different than the first color to thereby identify the second resistive value of the second resistive wordline load.

18. The integrated circuit of claim 15, wherein the multiple dummy wordline loads comprise a first resistive dummy wordline load with a first resistive dummy value, and wherein the multiple dummy wordline loads comprise a second resistive dummy wordline load having a second resistive dummy value that is less than the first resistive dummy value.

19. The integrated circuit of claim 18, wherein the first resistive dummy value of the first resistive dummy wordline load corresponds to a first set of bitcells of the multiple bitcells that are disposed in even numbered rows of the array of multiple bitcells, and wherein the second resistive dummy value of the second resistive dummy wordline load corresponds to a second set of bitcells of the multiple bitcells that are disposed in odd numbered rows of the array of multiple bitcells, and wherein the second resistive dummy value is less than the first resistive dummy value.

20. A method for manufacturing an integrated circuit, the method comprising:
- fabricating dummy wordline circuitry having a dummy wordline driver coupled to multiple dummy wordline loads via a dummy wordline;
- fabricating demultiplexer circuitry coupled to a first path of the dummy wordline between the dummy wordline driver and the dummy wordline load; and
- fabricating multiplexer circuitry coupled to a second path of the dummy wordline between the dummy wordline load and a dummy bitline load,
- controlling the demultiplexer circuitry and the multiplexer circuitry with one or more selection signals to select at least one of the multiple dummy wordline loads based on matching a resistive wordline load of a selected wordline.

* * * * *